United States Patent
Amemiya

(12) 
(10) Patent No.: US 6,169,409 B1
(45) Date of Patent: Jan. 2, 2001

(54) LOW-TEMPERATURE WAFER TESTING METHOD AND PROBER

(75) Inventor: Hiroshi Amemiya, Yamanashi-ken (JP)

(73) Assignee: Tokyo Electron Limited, Tokyo (JP)

( * ) Notice: Under 35 U.S.C. 154(b), the term of this patent shall be extended for 0 days.

(21) Appl. No.: 09/071,827

(22) Filed: May 4, 1998

(30) Foreign Application Priority Data

May 19, 1997 (JP) .................................................. 9-144728

(51) Int. Cl.$^7$ .................................................. G01R 31/26
(52) U.S. Cl. .......................................................... 324/754
(58) Field of Search ................................. 324/754, 760, 324/765, 755; 438/14, 18, 17; 257/48, 40; 165/27, 80.1, 80.2, 80.4; 361/699

(56) References Cited

U.S. PATENT DOCUMENTS 5,084,671   1/1992   Miyata et al. .

FOREIGN PATENT DOCUMENTS 60-180135   9/1985   (JP) .
63-207928   8/1988   (JP) .
1-158372    6/1989   (JP) .

Primary Examiner—Vinh P. Nguyen
(74) Attorney, Agent, or Firm—Oblon, Spivak, McClelland, Maier & Neustadt, P.C.

(57) ABSTRACT

A low-temperature wafer testing method and a prober therefor are disclosed. The prober includes a main chuck equipped to cool an object to be tested to a low temperature, a prober chamber, a probe card with probes, a ring-like member for supporting the probe card, and a plate provided for the ring-like member on an outer side of the probe card. The wafer placed on the main chuck is cooled initially. Then, dry gas which does not condense at the cooled temperature is supplied to a prober chamber. Gas in a space, defined by the ring-like member between the probe card and the plate, is replaced with the dry gas. With replacement by the dry gas, even if the gas in the space leaks into the prober chamber during a low-temperature test, condensing or icing on the wafer can be prevented.

7 Claims, 4 Drawing Sheets

LOW-TEMPERATURE WAFER TESTING METHOD AND PROBER

BACKGROUND OF THE INVENTION

The present invention relates to a prober for testing the electrical characteristics of an object to be tested, at a low temperature.

A conventional prober for testing the electrical characteristics of an object at a low temperature will now be described in connection with an example the prober for testing the electrical characteristics of integrated circuits formed on a semiconductor wafer. In the loader chamber 1, a fork 3 and a sub-chuck 4 are provided. A wafer W is placed by the fork 3, on the sub-chuck 4, where the wafer W is pre-aligned with respect to the orientation flat of the wafer W. In the prober chamber 2, a main chuck 5 and an alignment mechanism 6 are provided. The alignment mechanism 6 moves the main chuck 5 in the X, Y and θ directions, so as to align an electrode of an IC chip formed on the wafer W placed on the main chuck 5, with a probe 7A of a probe card 7 situated above the main chuck 5. An insert ring 9 is fixed to a head plate 8 which constitute a ceiling surface of the prober chamber 2, and the probe card 7 is detachably mounted to the insert ring 9. In order to test the electrical characteristics of the wafer W, the aligned main chuck 5 is moved in the X, Y and Z directions, so as to bring the electrode pads of the IC chips into electrical contact with the probe 7A one after another. Thus, each time the electrical contact is made, the electrical characteristics of the IC chips are tested via a test head T.

The testing of an object may be carried out at room temperature, low temperature or high temperature. Therefore, the main chuck 5 is equipped with a temperature adjusting mechanism for carrying out the test at necessary temperature. With the temperature adjusting mechanism, the temperature of the wafer W placed on the main chuck 5 is set in, for example, a range from several tens of ° C. below zero to room temperature, or a wide range from several tens of ° C. below zero to 160° C. In the case where an IC chip is tested at a low temperature of −40° C., the wafer W placed on the main chuck 5 is cooled down to −40° C. by the temperature adjusting mechanism. In the case of such a low-temperature test, a dry gas having a dew point much lower than −40° C., for example, dry air having a dew point of −70° C., is supplied into the prober chamber 2, so as to prevent condensing or icing from occurring on the surface of the wafer W during the low-temperature test. In order to shut the prober chamber 2 from outside, a shutting plate 10 is mounted on the insert ring 9 on the outer side of the probe card 7, and thus a space S defined by the probe card 7, the plate 10 and the insert ring 9 is created.

The space S in the insert ring in the conventional prober is shut off from outside by the plate 10, and is separated from the prober chamber 2 by the probe card 7. With this structure, even if the dry air is supplied into the prober chamber 2 during the low-temperature testing, the space S cannot be easily ventilated. As a result, the air having a high dew point in the prober chamber 2 remains in the space S. Consequently, if the air contained in the space S and having a high dew point leaks into the probe chamber 2 during the low-temperature test, and the air is brought into contact with the wafer W cooled at a low temperature, for example, −40° C., the moisture carried in the air condenses and ices instantaneously on the surface of the wafer W, and the connection between the probe 7A and the electrode pad of the IC chip is blocked. This results in the lowering of the reliability of the test. Particularly, in the test environment where the dew point is as low as −70° C., if air having a high humidity enters the prober chamber 2, the condensing and icing phenomena of the moisture of the air become further prominent.

BRIEF SUMMARY OF THE INVENTION

An object of the present invention is to provide a low-temperature testing method for a prober for testing the electrical characteristics of an object at low temperature, and a prober for performing such a test method.

Another object of the present invention is to a low-temperature testing method appropriate for testing the electrical characteristics of integrated circuits formed on a semiconductor wafer (to be called simply "a wafer") at low temperature, and a prober for performing such a test method.

Still another object of the present invention is to provide a low-temperature testing method capable of preventing the condensing and icing occurring on the surface of a semiconductor wafer during a low-temperature test, thereby achieving a highly reliable test, and a prober for performing such a test method, designed to solve the above-described problem of the prior art technique.

According to the first aspect of the present invention, there is provided a method of testing electrical characteristics of an object to be tested, at a predetermined low temperature, in a prober comprising:

a prober chamber;

a main chuck on which the object is placed in the prober chamber, the main chuck including a temperature adjusting mechanism for cooling the object to the predetermined low temperature;

a probe card with probes for testing the electrical characteristics of the object as being brought into contact with electrical pads of the object placed on the main chuck;

a ring-like member fixed to an upper portion of the prober chamber, for detachably supporting the probe card; and a plate provided for the ring-like member, at a position outward of the probe card, the plate creating a space defined by the ring-like member between the probe card and the plate itself, the method comprising:

(a) supplying dry gas which does not condense at the predetermined low temperature at which the object is tested, to the prober chamber;

(b) replacing a gas in the space with the dry gas;

(c) cooling the object to be tested to the predetermined low temperature by the temperature adjusting mechanism; and (d) testing the electric characteristics of the object at the low temperature.

According to the second aspect of the present invention, there is provided a testing method according to the first aspect, wherein the step (b) is carried out by supplying the dry gas which does not condense at the predetermined low temperature at which the object is tested, to the space from an outside of the prober chamber.

According to the third aspect of the present invention, there is provided a testing method according to claim 1, wherein the step (b) is carried out by supplying the dry gas supplied to the prober chamber in the step (a), to the space via the probe card.

According to the fourth aspect of the present invention, there is provided a prober comprising:

a main chuck on which an object is placed in the prober chamber, the main shuck including a temperature adjusting mechanism for cooling the object to the predetermined low temperature;

a prober chamber in which the main chuck is placed, the prober chamber is filled with dry gas which does not condense at the predetermined low temperature;

a probe card with probes for testing the electrical characteristics of the object as being brought into contact with electrical pads of the object placed on the main chuck;

a ring-like member fixed to an upper portion of the prober chamber, for detachably supporting the probe card; and a plate provided for the ring-like member, at a position outward of the probe card, the plate creating a space defined by the ring-like member between the probe card and the plate itself; and a dry gas supplying mechanism for supplying a dry gas which does not condense at the predetermined low temperature to the space, thereby replacing the gas in the space with the dry gas.

According to the fifth aspect of the present invention, there is provided a prober according to the fourth aspect, wherein the dry gas supply mechanism is of a type for supplying dry gas which does not condense at the predetermined low temperature at which the object is tested, to the space from an outside of the prober chamber.

According to the sixth aspect of the present invention, there is provided a prober according to the fourth aspect, wherein the dry gas supply mechanism includes a gas passage which is communicated to the outside, provided for at least one of between the plate and ring-like member, and between the plate and a joint portion if the ring-like member, and serves to supply the dry gas which fills the prober chamber to the space via the probe card such as to exhaust the gas in the space to the outside via the gas passage, thereby replacing the gas in the space with the dry gas.

According to the seventh aspect of the present invention, there is provided a prober according to the fourth aspect, wherein the gas passage of the dry gas supplying mechanism is a gap created with a spacer mounted to a screw member used for fastening the plate and insert ring together.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention relates to a low-temperature test method carried out with a prober for testing the electrical characteristics of an object at low temperature, and the following description will be made in connection with a typical example of the prober, that is, the type for testing integrated circuits formed on a semiconductor wafer.

Figure 6:
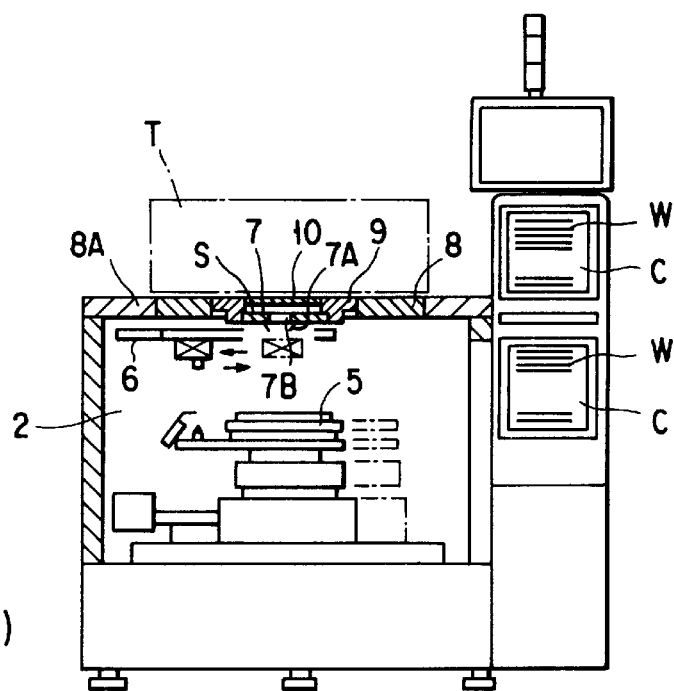
FIG. 6 is a partial cross sectional cutaway view of the prober chamber of a conventional prober.
Figure 7:
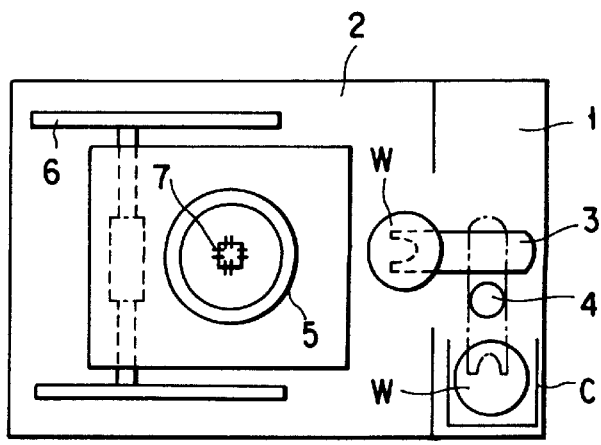
FIG. 7 is a diagram showing the internal structure of the prober shown in FIG. 5.

FIGS. 1 to 5 show embodiments of the present invention, and the structural members similar or corresponding to those of the prior art technique are designated by the same reference numerals. A prober according to an embodiment of the present invention includes a loader chamber 1, a prober chamber 2, a fork 3, a sub-chuck 4, a main chuck 5, an alignment mechanism (not shown), a probe card 7, a head plate 8 and a ring-shaped member (to be called "insert ring" hereinafter) 9, as in the case of the conventional prober shown in FIG. 6 or 7. Although not shown, the prober chamber 2 has a supply opening through which dry gas (for example, air) is supplied. Through the supply opening, dry gas having a dew point of, for example, −70° C., is supplied into the prober chamber 2, and thus the prober chamber 2 is filled with the dry gas. Thus, the environment within the prober chamber 2 is maintained at such a dew point that icing does not occur on the wafer W placed on the main chuck 5, and cleaned at all times. The main chuck 5 is equipped with the temperature adjusting mechanism (not shown). The wafer W placed on the main chuck 5 is cooled down to a low temperature of, for example, about −60° C., by the temperature adjusting mechanism, and the electrical characteristics are tested. Alternatively, it is possible to heat the wafer W to about +160° C. by the temperature adjusting mechanism, and test it at a high temperature.

Figure 1:
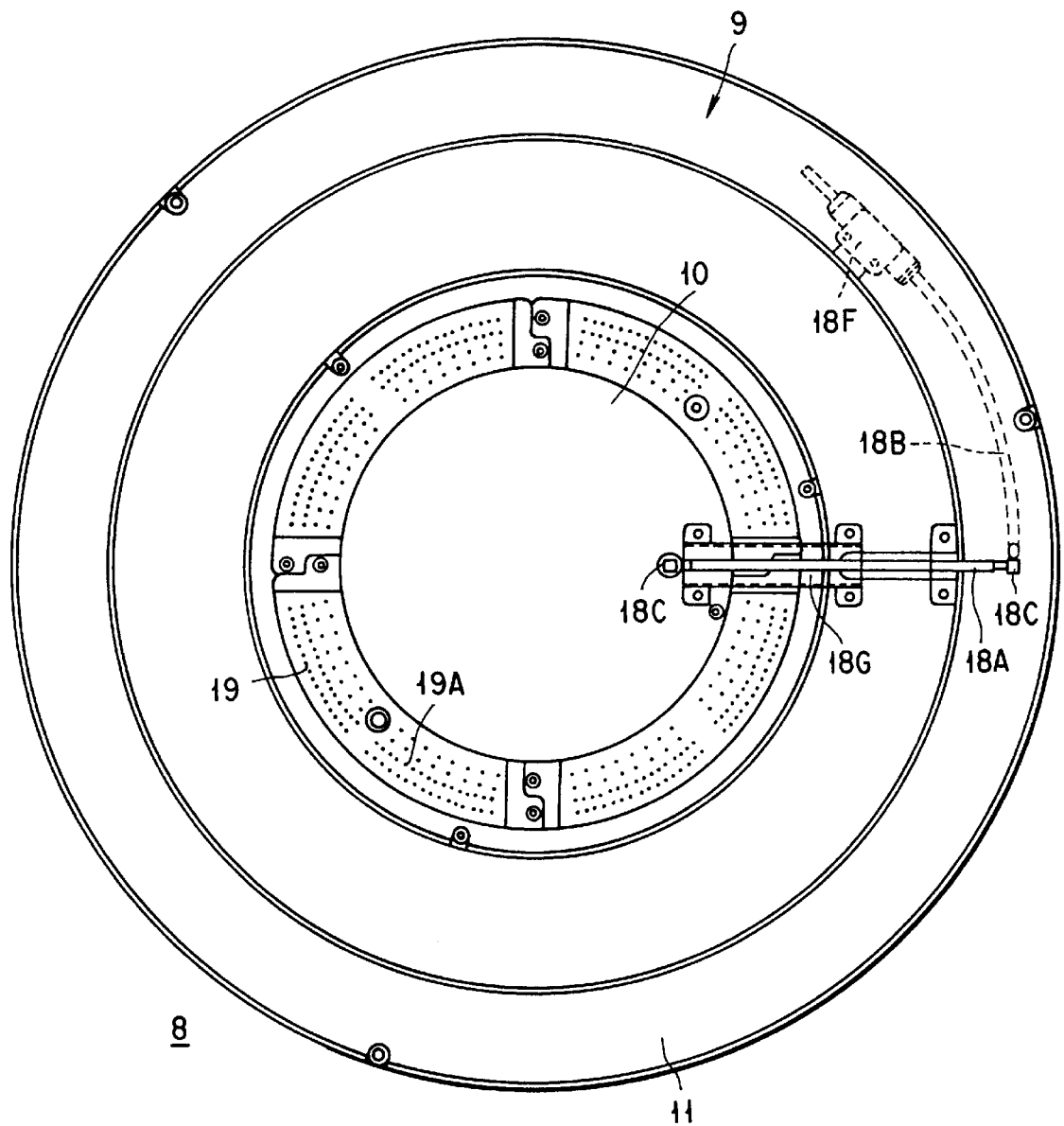
FIG. 1 is a plan view showing an insert ring in an embodiment of the prober according to the present invention.
Figure 2:
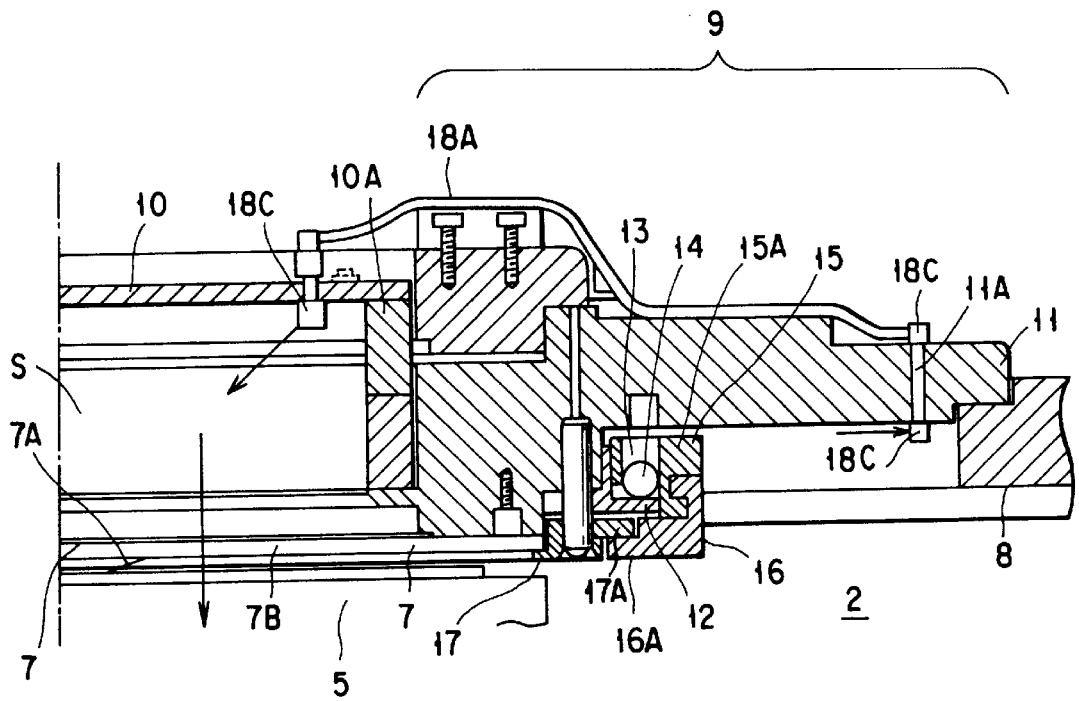
FIG. 2 is a cross sectional view of a main portion of the insert ring shown in FIG. 1.

To the head plate 8 of the prober chamber 2, the insert ring 9 shown in, for example, FIG. 1 or 2, is fixed, and the probe card 7 is replaced automatically or semi-automatically by the other probe card 7. As can be seen in FIG. 1 or 2, the insert ring 9 includes a fixation ring 11 fixed to the head plate 8, a cylinder ring 12 fit to the lower surface of the fixation ring 11, an O ring 14 mounted to a ring-shaped groove formed around the entire outer circumferential surface of the cylinder ring 12 so as to form a gas-tight space 13, a piston ring 15 having a flange portion 15A serving to hold the O ring 14, and a card supporting ring 16 engaged with the outer circumferential surface of the piston ring, to be rotatable in the circumferential direction. The piston ring 15 is set to be ascendible/descendable along the outer circumferential surface of the cylinder ring 12.

As can be seen in FIG. 2, the plate 10 is provided on the inner circumferential surface of the fixation ring 11, on the outer side of the probe card 7 via a spacer 10A, and the opening of the insert ring 9 is closed. Thus, the space S defined by the probe card 7, the plate 10 and the fixation ring 11 is created. It should be noted that in FIG. 1, there is the head plate 8 on the outer side of the insert ring 9, and in FIG. 2, there is the prober chamber 2 on the lower side of the insert ring 9.

On the inner circumferential surface of the card supporting ring 16, a plurality of engaging members 16A are arranged in the circumferential direction at the same interval between them, to face inwards. On the outer circumferential surface of the card holder 17 on which the probe card 7 is mounted, a plurality of projecting engagement members 17A are arranged in the circumferential direction at the same interval between them, to face outwards. As the projecting engagement members 17A of the card holder 17 pass between the respective engaging members 16A of the card supporting rings 16, and the card supporting ring 16 is rotated in the circumferential direction, the engaging members 16A engage with the respective projecting engagement members 17A, and thus the card holder 17 is supported by the card supporting ring 16.

A passage (not shown) which communicates the gas tight chamber 13 to outside is formed in the fixation ring 11 and the cylinder ring 12. To the passage, for example, a gas supply source (not shown) is connected, and compressed air is supplied from the air supply source to the air tight chamber 13 via the passage. The gas pressure in the air tight chamber 13 increases as the compressed air is supplied, and thus the piston ring 15 is ascended. As the piston ring 15 is ascended, the card supporting ring 16 is accordingly ascended; therefore the card holder 17 is clamped by the card supporting ring 16 and the cylinder ring 12, and the probe card 7 mounted on the card holder 17 is fixed to the fixation ring 11. In order to automatically or semi-automatically replacing the probe card 7 with another, the compressed air in the air tight chamber 13 is exhausted, and the card supporting ring 16 is descended together with the piston ring 15, thereby separating the card holder 17 from the cylinder ring 12. Then, the card supporting ring 16 is rotated, thus releasing the engagement state between the projecting engagement members 17A of the card holder 17 and the engaging members 16A of the card supporting ring 16. Thus, the probe card 7 is removed.

Figure 3:
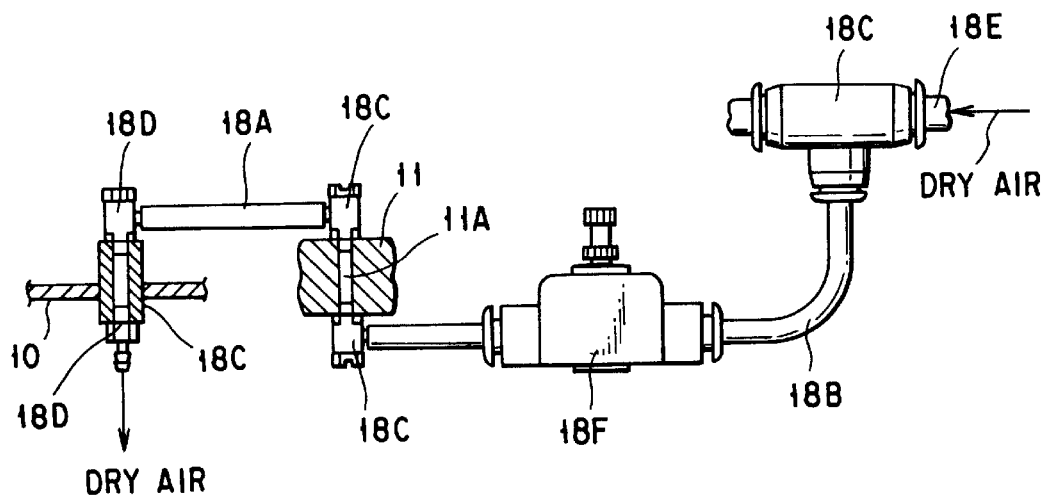
FIG. 3 is a schematic view showing the structure of air introducing means mounted to the insert ring shown in FIG. 2.

In the prober of this embodiment, gas introducing means 18 for introducing a dry gas (air) to the space S shown in FIGS. 1 to 3 is provided. With the air introducing means 18, the gas having a high dew point, which is remaining in the space S is replaced with the dry gas. The gas introducing means 18, as shown in FIGS. 1 and 2, includes a first gas pipe 18A provided along the surface of the insert ring 9, and a second gas pipe 18B provided on the inner surface of the fixation ring 11 along the circumferential direction. The first gas pipe 18A is connected to a section of the joint of the contact ring 19, other than a terminal 19A is provided. One end of the first gas pipe 18A is connected to the upper end of a coupling member 18C on the surface side, piercing through a coupler 18D, and is opened into the space S via the coupler 18D connected to the lower end of the coupling member 18C.

As can be seen in FIG. 2, the other end of the first gas pipe 18A is connected to a piercing hole 11A of the fixation ring 11 via a coupler 18C. To the piercing hole 11A, one end of the second gas pipe 18B is connected via the coupler 18C. The other end of the second gas pipe 18B is connected via the coupler 18C to a gas pipe 18E (see FIG. 3) which extends from the dry gas supply source (not shown). The gas pipe 18E is connected to the source of supplying dry gas to the prober chamber 2. Further, a flow adjusting meter 18F is provided for the second gas pipe 18B, and the flow of the dry gas is adjusted with the flow adjusting meter 18F. In this embodiment, the dry gas of the same supply source is supplied to both the prober chamber 2 and the space S. It should be noted here that FIG. 1 illustrates the contact ring 19, the terminal 19A and a cover 18G for protecting the first gas pipe 18A.

The low-temperature testing method which uses the above-described prober will now be described. In order to carry out a low-temperature test, dry gas is supplied in advance to the prober chamber 2, and dry gas is supplied to the space S located above the probe card 7 by the gas introducing means 18. The atmosphere within the prober chamber 2 is adjusted to have a dew point appropriate for a low-temperature control. At the same time, the gas in the space S is pushed out into the prober chamber 2 by the dry gas, and exhausted to the outside together with the gas in the prober chamber 2. After that, a wafer W is conveyed from the loader chamber onto the main chuck 5 within the prober chamber 2. Then, the wafer W is aligned as the main chuck 5 is moved in the X, Y and θ directions in the prober chamber 2. Then, the main chuck 5 is overdriven in the Z direction directly underneath the probe card 7, and thus the prober 7A of the probe card 7 is brought into electrical contact with an electrode of an IC chip formed on the wafer W placed on the main chuck 5 as can be seen in FIG. 1. The same dry gas as that within the prober chamber 2 is supplied to the space S situated above the probe card 7, via the gas introducing means 18. Therefore, even if the dry gas supplied to the space S flows towards the surface of the wafer W placed on the main chuck 5, the condensing or icing of the moisture does not occur on the surface of the wafer W, unlike in the prior gas technique, thus making it possible to maintain a good electrical conduction between the prober 7A and the electrode pad of the IC chip.

As described above, according to this embodiment, the gas introducing means 18 for introducing dry gas into the space S between the probe card 7 and the plate 10 is provided. With this structure, during a low-temperature test, the dry gas having a dew point appropriate for the test is supplied to the space S between the probe card 7 and the plate 10 via the gas introduction tube 18, and therefore the same dry gas as that in the prober chamber 2 is brought into contact with the wafer W during the test. Consequently, the condensing or icing of moisture does not occur on the surface of the wafer W, and a highly reliable low-temperature test can be carried out.

The above embodiment was described in connection with the case of the prober having a joint in the substrate on which the terminal 19A of the contact ring 19 is formed; however as another embodiment, there is a prober in which a terminal is formed all along the entire circumference of the contact ring. In this case, means shown in FIGS. 4A, 4B, 4C or 5 is provided in place of the gas introducing means 18.

Figure 4A:
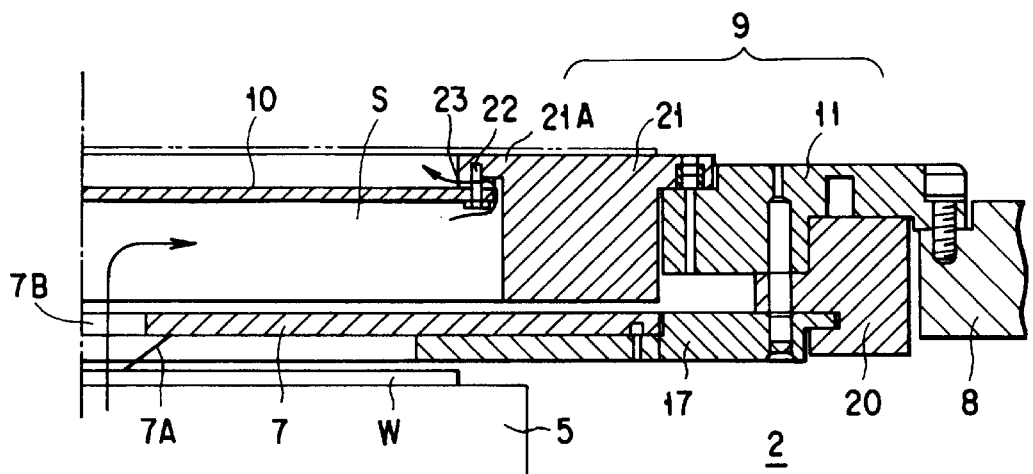
FIGS. 4A, 4B and 4C are cross sectional views of other embodiments of the prober according to the present invention, which correspond to FIG. 2.
Figure 5:
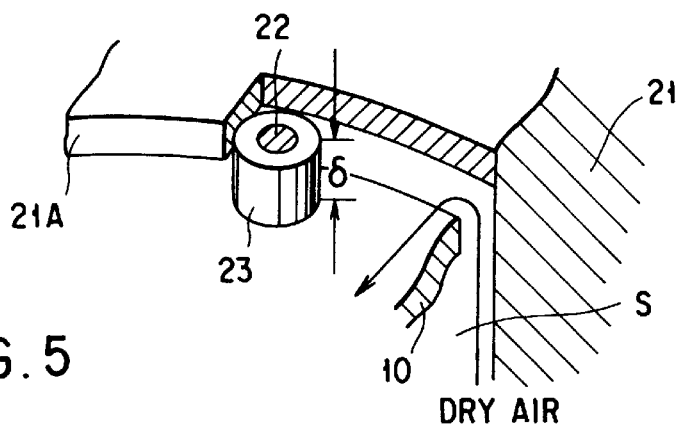
FIG. 5 is a partial cutaway and enlarged view of the main portion of the insert ring shown in FIG. 4A.

An insert ring 9 shown in FIG. 4A has a fixation ring 11 and a clamp ring 20 for clamping a probe card 7, and a card holder 17 to which the probe card 7 is mounted, is fixed to the clamp ring 20. A ring member 21 is set in the inner circumference of the fixation ring 11, and a flange 21A is formed on the upper end of the inner circumferential surface of the ring member 21. A plate 10 is fixed to the lower surface of the flange 21A by means of screw members 22 arranged at the same interval in the circumferential direction. Each of the screw members 22 is fit in a ring-like spacer 23, and with this spacer 23, a gap δ is provided between the plate 10 and the flange 21A (FIG. 5). The space S is communicated to outside via the gap δ serving as a gas passage, as well as to the prober chamber 2 via an opening section 7B of the probe card 7. In order to carry out a low-temperature test, dry gas is supplied to the prober chamber 2 and therefore the inside of the prober chamber 2 is made to have a pressure higher than the atmospheric pressure. Consequently, the dry gas in the prober chamber 2 flows into the space S through the opening section 7B of the probe card 7, and further flows to the outside via the gap δ.

The low-temperature testing method which uses the above-described prober will now be described. In order to carry out a low-temperature test, dry gas is supplied in advance to the prober chamber 2, and the atmosphere within the prober chamber 2 is adjusted to have a dew point appropriate for a low-temperature control. Thus, the atmosphere in the prober chamber 2 is made to have a positive pressure. After the alignment of the wafer W, the main chuck 5 is overdriven in the Z direction, and thus the prober 7A of the probe card 7 is brought into electrical contact with the wafer W placed on the main chuck 5 as can be seen in FIG. 4. During this operation, the same dry gas as that within the prober chamber 2 flows into the space S through the opening section 7B of the probe card 7, and then flows to the outside via the gas passage (gap) $\delta$ made between the plate 10 and the flange 21A of the ring member 2 as indicated by arrows in FIGS. 4A and 5. Therefore, the air in the space S is pushed to the outside at all times for ventilation, and therefore air cannot enter the space S from outside. Consequently, only the dry gas is brought into contact with the surface of the wafer W placed on the main chuck 5, and the condensing or icing of the moisture does not occur on the surface of the wafer W, unlike in the prior art technique, thus making it possible to maintain a good electrical conduction between the prober 7A and the electrode pad of the IC chip.

Figure 4B:
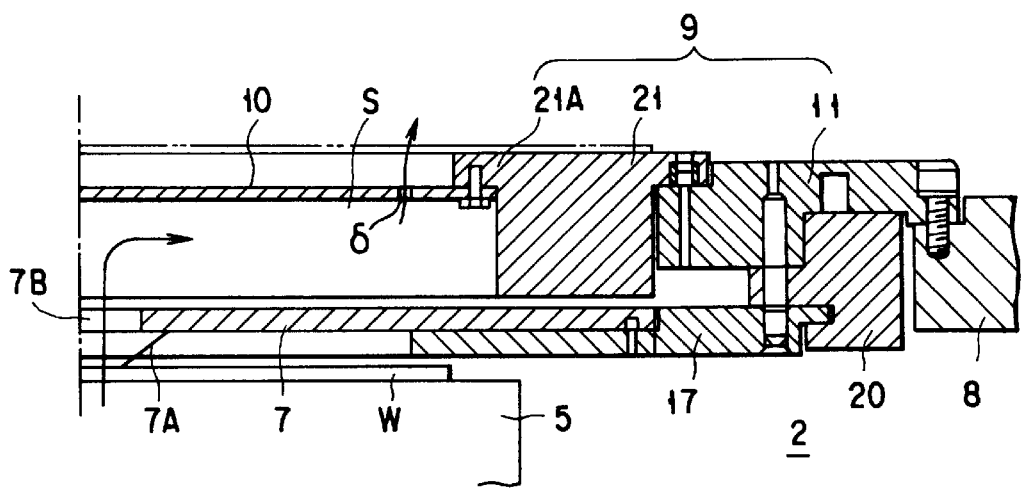
Figure 4C:
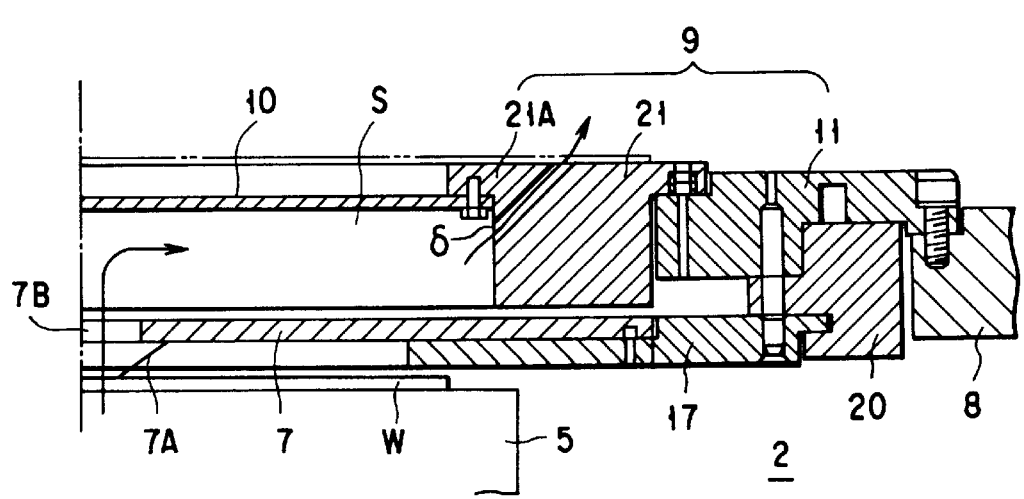

In the just-described embodiment, the gas passage is the gap $\delta$ made by the plate 10 and the ring member 21 joined together via screw members provided with spacers 23. Alternatively, it is possible to make the gas passage $\delta$ in the plate as can be seen in FIG. 4B, or in the ring member 21 as can be seen in FIG. 4C.

As described above, according to the present invention, there is provided a low-temperature testing method capable of preventing condensing or icing on the surface of a semiconductor wafer during the low-temperature test, thus achieving a highly reliable test, and a prober used for such a method.

The present invention has been described with reference to the embodiments shown in FIGS. 1 to 5; however the application of the invention is not limited to these embodiments, but can be modified into various versions.

The above-described embodiments illustrate the cases where the present invention is applied to the prober for testing the electrical characteristics of an IC chip formed on a semiconductor wafer as an object to be tested. The present invention can be applied to, for example, a prober for testing the electrical characteristics of electronic components other than IC chip (for example, printed circuit board and liquid crystal) or various types of electronic products.

In the above-described embodiments, the temperature adjusting mechanism placed on a main chuck is described to be of the type having cooling means for testing an object at low temperature; however the mechanism may be of a type which is applicable not only to the test at low temperature, but to the test conducted at room temperature or high temperature.

In the above-described embodiments, the insert ring equipped with a fixation ring or the like, is used as the ring-like member; however any type of ring-like member can be employed as long as a probe card can be set to the main body of the apparatus via or not via the card holder. For example, in the embodiments, the fixation ring and cylinder ring, and the fixation ring and ring member are described to be separate parts; however they may be formed into an integrated structure. Further, the shape of the inner side of the fixation ring is round in the embodiments; however it may be rectangular or some other shape.

In the above-embodiments, the method is described to have the following steps of: (a) supplying dry gas to the prober chamber; (b) replacing the gas in the space defined by the ring-like members between the probe card and plate, with dry gas; (c) cooling the object to be tested to a predetermined low temperature by a temperature adjusting mechanism; and (d) testing the electric characteristics of the object at the low temperature, carried out in this order. However, it is not necessary to perform these steps in the abovelisted order. As alternative versions, the order of the steps may be switched or some steps can be carried out at the same time.

Further, in the step (b), the dry gas may be supplied to the space S continuously or intermittently.

In the above-described embodiments, the tests carried out at low temperatures of −40° C., −60° C. and −70° C.; however the present invention is not limited to these temperatures, but is applicable to tests carried out at any temperatures at which condensing or icing occurs on the semiconductor wafer during a test.

In the embodiments, the dry gas is used as dry gas; however some other type of gas, which is appropriate for the test, for example, inert gas, can be used as the dry gas.

Lastly, the embodiments were described in connection with the case where the gap $\delta$ is created with use of the spacer, between the plate 10 and the flange 21A, as one of the gas passages connecting between the space defined by the ring-like members between the probe card and the plate, and the atmosphere of the outside. It is also possible in the present invention to create a gap between the plate 10 and the flange 21A by making a cut section in the outer periphery of the flange 21A or the plate 10.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of testing electrical characteristics of an object to be tested, at a predetermined low temperature in a prober which includes:

a prober chamber;

a main chuck on which the object is placed in the prober chamber;

a probe card with probes for testing the electrical characteristics of the object as brought into contact with electrical pads of the object placed on the main chuck;

a ring-like member, fixed to an upper portion of the prober chamber, for detachably supporting the probe card;

a plate provided for said ring-like member at a position outward of the probe card, said plate creating a space defined by said ring-like member between the probe card and said plate itself; and a dry gas supplying mechanism for supplying a dry gas, which does not condense at the predetermined low temperature, to the space so that gas in the space is replaced with the dry gas;

said method comprising the steps of:

(a) supplying the dry gas, which does not condense at the predetermined low temperature at which the object is tested, from the dry gas supplying mechanism to the prober chamber;

(b) replacing the gas in the space with said dry gas by the dry gas supplying mechanism;

(c) cooling the object to be tested to the predetermined low temperature; and (d) testing the electric characteristics of the object at the low temperature.

2. A testing method according to claim 1, wherein the step (b) is carried out by supplying the dry gas to said space from the gas supply mechanism which is located outside the prober chamber.

3. A testing method according to claim 1, wherein the step (b) is carried out by supplying the dry gas to said space via said probe card.

4. A prober comprising:

a main chuck on which an object is placed;

a prober chamber in which said main chuck is placed, said prober chamber being filled with a dry gas which does not condense at a predetermined low temperature;

a probe card with probes for testing electrical characteristics of the object as being brought into contact with electrical pads of the object placed on the main chuck;

a ring-like member, fixed to an upper portion of the prober chamber, for detachably supporting the probe card; and a plate provided for said ring-like member at a position outward of said probe card, said plate creating a space defined by said ring-like member between the probe card and said plate itself; and a mechanism for supplying the dry gas to the space, thereby replacing a gas in the space with the dry gas.

5. A prober according to claim 4, wherein said mechanism is supplying dry gas to said space from the prober chamber.

6. A prober according to claim 4, wherein said mechanism includes a gas passage which is communicated between the space and the prober chamber, provided for at least one of between the plate and the ring-like member, and between the plate and a joint portion of the ring-like member, and serves to supply the dry gas via the probe card so as to exhaust the gas in the space to outside via said gas passage, thereby replacing the gas in the space with said dry gas.

7. A prober according to claim 6, wherein said gas passage of said mechanism is a gap created with a spacer mounted to a screw member used for fastening the plate and the ring-like member together.

* * * * *